United States Patent

Yoda et al.

[19]

[11] Patent Number: 6,061,211
[45] Date of Patent: May 9, 2000

[54] MAGNETIC SENSOR INCLUDING A SPIN VALVE MAGNETORESISTANCE EFFECT FILM

[75] Inventors: Hiroaki Yoda, Kawasaki; Masashi Sahashi, Yokohama, both of Japan

[73] Assignee: Kabushiki Kaisha Toshiba, Japan

[21] Appl. No.: 08/998,220

[22] Filed: Dec. 24, 1997

Related U.S. Application Data

[62] Division of application No. 08/791,834, Jan. 30, 1997, Pat. No. 5,712,751, which is a continuation of application No. 08/406,319, Mar. 16, 1995, abandoned.

[30] Foreign Application Priority Data

Mar. 17, 1994 [JP] Japan ................................... 6-046613

[51] Int. Cl.[7] ....................................................... G11B 5/39
[52] U.S. Cl. ............................................................ 360/113
[58] Field of Search ................................... 360/113, 125, 360/126; 338/32 R; 324/252

[56] References Cited

U.S. PATENT DOCUMENTS

| | | | |
|---|---|---|---|
| 3,840,898 | 10/1974 | Bajorek et al. | 360/113 |
| 4,663,685 | 5/1987 | Tsang | 360/113 |
| 5,206,590 | 4/1993 | Dieny et al. | 324/252 |
| 5,287,238 | 2/1994 | Baumgart et al. | 360/113 |
| 5,301,079 | 4/1994 | Cain et al. | 360/113 |
| 5,408,377 | 4/1995 | Gurney et al. | 360/113 |
| 5,438,470 | 8/1995 | Ravipati et al. | 360/113 |
| 5,442,507 | 8/1995 | Koga et al. | 360/113 |
| 5,638,235 | 6/1997 | Gill et al. | 360/113 |

FOREIGN PATENT DOCUMENTS

| | | |
|---|---|---|
| 3-108112 | 5/1991 | Japan . |
| 4-358310 | 12/1992 | Japan . |
| 5-89435 | 4/1993 | Japan . |

*Primary Examiner*—Jefferson Evans
*Attorney, Agent, or Firm*—Finnegan, Henderson, Farabow, Garrett & Dunner, L.L.P.

[57] ABSTRACT

A magnetic sensor comprises a pair of hard magnetic films magnetized inplane in directions substantially perpendicular to the direction of a signal magnetic field and substantially equal to each other, a soft magnetic film formed in the same plane as the pair of hard magnetic films and interposed between the pair of hard magnetic films and held in contact therewith or in proximity thereto, and a signal magnetic field detecting film superposed on the main surface of the soft magnetic film. A magnetic recording-reproducing head using this reproducing head comprises the reproducing head mentioned above, a pair of magnetic pole layers vertically opposed to each other through the medium of a recording gap, and a recording head possessed of a recording track width equal to or smaller than the reproducing track width of the reproducing head. The reproducing track width $L_1$ is so set as to satisfy the relation, $L_2 \leq L_1 < L_3$, wherein $L_2$ stands for the width of a track written in a magnetic recording medium by the recording head and $L_3$ for the distance between the tracks adjacent to the track mentioned above.

6 Claims, 13 Drawing Sheets

TRACK n-1    TRACK n    TRACK n+1

*PRIOR ART*

PRIOR ART

MAGNETIC SENSOR INCLUDING A SPIN VALVE MAGNETORESISTANCE EFFECT FILM

This application is a Divisional of Ser. No. 08/791,834 filed Jan. 30, 1997, now U.S. Pat. No. 5,712,751, which is a File Wrapper Continuation of Ser. No. 08/406,319 filed Mar. 16, 1995, now abandoned.

BACKGROUND OF THE INVENTION

1. Field of the Invention

This invention relates to a magnetic sensor utilizing magnetoresistance, a magnetic recording•reproducing head, and a magnetic recording•reproducing apparatus using the magnetic sensor.

2. Description of the Related Art

As a means for reading out a signal recorded in a magnetic recording medium, the method which comprises causing a reading magnetic head as a magnetic sensor possessed of a coil to be moved relative to the magnetic recording medium and detecting the voltage which is induced in the coil by the electromagnetic induction generated in consequence of the relative motion has been widely known heretofore.

Meanwhile, the magnetoresistance (hereinafter referred to as "MR") head which utilizes the phenomenon that the electrical resistance of a certain kind of ferromagnetic body is varied proportionately to the intensity of an external magnetic field has been finding recognition as a high-sensitivity head adapted for the detection of a signal magnetic field of the magnetic recording medium. In recent years, magnetic recording media have been trending toward smaller sizes and larger capacities and the relative speeds between reading magnetic heads and magnetic recording media have been on the decrease and, accordingly, expectations for an MR head which is capable of reading out a large output in spite of a small relative speed have been mounting.

When an MR head is actually used as a magnetic reproducing head, it is generally necessary that two kinds of bias magnetic field be applied to the MR element. One of the two kinds is a magnetic field designated as that of lateral bias which is applied substantially perpendicularly to the sense current for detecting the variation of the resistance of the MR element. This is the bias magnetic field which is intended to set the point of operation of the MR element in a linear region in which the magnitude of an external signal is proportionate to that of a detecting signal. As concrete examples of the method for applying the lateral bias, a self bias method which comprises parallelly opposing an MR film and a soft magnetic film through the medium of a thin nonmagnetic film and utilizing a magnetic field generated by a sense current as the lateral bias and a shunt bias method are generally cited. The other kind of bias magnetic field to be applied to the MR element is a magnetic field designated as that of longitudinal bias which is applied substantially parallelly to the sense current of the MR element. This is the bias magnetic field which is intended to repress the occurrence of Barkhausen noise due to the multidomain property by imparting a single domain property to the MR film which is a ferromagnetic film.

Numerous reports have been heretofore published regarding the method for applying such longitudinal bias as described above. U.S. Pat. No. 4,663,685, for example, discloses a technique for applying uniform longitudinal bias to the MR film by the exchange coupling of an antiferromagnetic film and a ferromagnetic film. FIG. 18 is a perspective view illustrating one example of the construction of an MR element having longitudinal bias applied to an MR film by the use of an antiferromagnetic film. In the MR element of this construction, antiferromagnetic films 3 and 3 are formed as interposed between the opposite end parts in the direction of track width of the MR film destined to serve as a signal magnetic field detecting film 1 and terminals 2 and 2 for supplying a sense current, for example, as shown in the diagram. In FIG. 18, the MR film is depicted as formed on a substrate 6 so as to be opposed to a soft magnetic film 5 through the medium of a nonmagnetic film 4. The magnetic field generated by the sense current is applied as lateral bias to the MR film.

The construction of the element shown in FIG. 18, however, entails the problem of encountering difficulty in repressing the exchange coupling force with the antiferromagnetic films 3 and 3 to the extent of preventing the magnetizations of the opposite end parts of the MR film destined to form the signal magnetic field detecting film 2 from being fixed and consequently suffered to impair the soft magnetic property. Though the magnetizations of the opposite end parts of the MR film are not completely fixed, at least the soft magnetic property of the MR film differs between the opposite end parts and the central part thereof. When the MR film is used for a magnetic reproducing head, therefore, it becomes difficult to attain accurate regulation of the track width. Further, since the γ-FeMn alloy generally used for the antiferromagnetic film 3 is deficient in resistance to corrosion, the antiferromagnetic film 3 necessitates provision therefor a protective film, for example. The process used for the production of this film, therefore, is complicated.

U.S. Pat. No. 3,840,898 discloses an MR element which applies longitudinal bias to an MR film by the magnetostatic coupling between ferromagnetic films. FIG. 19 is a perspective view illustrating an example of the construction of this MR element. In the MR element, the MR film destined to serve as a signal magnetic field detecting film 1 is opposed to a hard magnetic film 8 through the medium of a thin nonmagnetic film 7 on a substrate 6 as shown in the diagram. Terminals 2 and 2 for supplying a sense current are formed on the opposite end parts in the direction of track width of the hard magnetic film 8. In this construction, a magnetization $M_1$ having a component perpendicular to the film surface is generated within the hard magnetic film 8 because hexagonal c axis, for example, of the hard magnetic film 8 is almost inplane oriented but there exists perpendicular component to the film surface. As a result, not only a bias magnetic field $M_2$ from the opposite end parts in the direction of track width of the hard magnetic film 8 but also a leak magnetic field $M_3$ near the center of the hard magnetic film 8 is applied to the MR film via the nonmagnetic film 7. As a result, the soft magnetic property of the MR film destined to serve as the signal magnetic field detecting film 1 is impaired and the sensitivity of the MR element is consequently degraded.

Since the soft magnetic property of a MR film is impaired when the longitudinal bias is applied near the center of the MR film as described above, it has been proposed to obtain a construction for applying longitudinal bias by forming a hard magnetic film exclusively near the opposite end parts in the direction of track width of a MR film. Particularly, JP-A-05-89,435, JP-A-03-108,112, etc. disclose attempts to simplify the process for production of an MR element by fixing the magnetic moment of the opposite end parts in the direction of track width of an MR film and a soft magnetic film for application of lateral bias thereby forming hard magnetic films for application of longitudinal bias. FIG. 20 and FIG. 21 are perspective views which show examples of the constructions of MR elements disclosed in JP-A-05-89, 435 and JP-A-03-108,112.

The MR film shown in FIG. 20 is produced by forming an MR film on a substrate 6 and then incorporating a desired impurity component in the opposite end parts of the MR film thereby fixing the magnetic moment of the opposite end parts exclusively. The fixed regions function as hard magnetic films 3 and 3 and the part intervening therebetween functions as a signal magnetic field detecting film 1. The magnetic fields from the fixed regions functioning as the hard magnetic films 3 and 3 are applied as longitudinal bias to the MR film serving as the signal magnetic field detecting film 1. Terminals 2 and 2 for supplying a sense current are superposed on the hard magnetic films 3 and 3. The MR element shown in FIG. 21 is obtained by sequentially superposing an MR film destined to serve as a signal magnetic field detecting film 1, a nonmagnetic film 9, and a soft magnetic amorphous film in the order mentioned on a substrate 6 and crystallizing the opposite end parts in the direction of track width of the soft magnetic amorphous film by exposure to a laser beam. Then, the central part of the soft magnetic amorphous film is made to function as a soft magnetic film 10 for application of lateral bias and the crystallized opposite end parts are made to function as hard magnetic films 3 and 3 for application of longitudinal bias. Terminals for supplying a sense current are formed on the hard magnetic films 3 and 3.

In the case of the MR element shown in FIG. 20, however, the magnetizations near the opposite end parts of the MR film as the signal magnetic field detecting film 1 are still liable to be fixed. The MR element, therefore, has the problem that the whole area of the MR film in the direction of track width cannot be used as a signal magnetic field sensing part and the track width cannot be accurately regulated. Further, since this MR element must use for the MR film a ferromagnetic substance which is capable of being fixed by incorporation of an impurity component and, therefore, entrains a heavy restriction on the selection of material, it is not allowed to use for the MR film a ferromagnetic substance exhibiting a highly satisfactory soft magnetic property and possessing an ample ratio of variation of resistance. Then, in the MR element shown in FIG. 21, magnetic poles formed in the end parts of the hard magnetic films 3 and 3 are utilized for applying to the opposite end parts in the direction of track width of the MR film as the signal magnetic field detecting film 1 a magnetic field of a direction opposite to the direction of the magnetic field applied to the central part. The MR element, therefore, incurs difficulty in imparting a single domain property to the MR film and has no ability to repress the Barkhausen noise of the MR element sufficiently. The magnetic poles formed in the end parts of the hard magnetic films 3 and 3 constitute themselves a factor for obscuring the track width of the signal magnetic field detecting film 1.

JP-A-04-358,310 discloses an MR element provided with a spin valve film exhibiting giant magnetoresistance and adapted to apply longitudinal bias to a ferromagnetic film destined to serve as a signal magnetic field detecting film by the use of a hard magnetic film. FIG. 22 is a perspective view showing an example of the construction of this MR element. As shown in the diagram, in this MR element, a ferromagnetic film destined to serve as a signal magnetic field detecting film 1 is formed on a substrate 6, a nonmagnetic film 11 and a ferromagnetic film 12 are superposed sequentially in the order mentioned in the central part in the direction of track width of the ferromagnetic film, and the magnetization of the ferromagnetic film 12 is fixed in a direction substantially perpendicular to the direction of track width to form a spin valve film 1. On the opposite end parts in the direction of track width of the ferromagnetic film destined to serve as the signal magnetic field detecting film 1, hard magnetic films 33 for the application of longitudinal bias and terminals 2 and 2 for the supply of a sense current are formed.

In the MR element described above, however, the whole area in the direction of track width of the signal magnetic field detecting film 1 is not allowed to form a signal magnetic field sensing part because the magnetization of the ferromagnetic film destined to serve as the signal magnetic field detecting film 1 tends to be fixed directly under and near the edge of the hard magnetic films 3 and 3. As a result, it has the problem of its inability to regulate accurately the track width. Further, the regulation of the direction of magnetization of the ferromagnetic film 12 is not easily attained because the magnetic field from the hard magnetic films 3 and 3 is applied also to the ferromagnetic film 12.

When the magnetic sensor provided with the signal magnetic field detecting film exhibiting magnetoresistance as described above is used as a magnetic reproducing head, for example, the MR element using the conventional method for the application of longitudinal bias is at a disadvantage in terms of construction of a device as in incurring difficulty in accurately regulating the track width and in entailing degradation of sensitivity. This problem gains in prominence when the width of the track is decreased for the purpose of exalting record density.

Further, such obscurity of the track width of the magnetic reproducing head as mentioned above also forms a cause for the following problem when the magnetic reproducing head is used as a magnetic head in which recording head is integrated on a reproducing head. Specifically, as a magnetic head which uses a shield type MR head as a reproducing head, the construction shown in FIG. 23 is generally adopted, for example. As shown in the diagram, an MR film designed to serve as a signal magnetic field detecting film 1 and terminals for the supply of a sense current are formed on a lower shield layer 14 through the medium of a magnetic gap 15. On the MR film and the terminals 2 and 2, an upper shield layer 17 is formed through the medium of a magnetic gap 16. These components jointly form a reproducing head utilizing magnetoresistance. Since the upper shield layer 17 concurrently serves as a lower magnetic pole layer for the recording head, an upper magnetic pole layer 19 is formed thereon through the medium of a recording gap 18.

Then, in the conventional magnetic head, since the reproducing head does not allow accurate regulation of the track width thereof, the track width of the recording head is generally larger than that of the reproducing head. In the conventional magnetic head constructed as shown in FIG. 23, the difference of height produced on the reproducing head side by the terminals 2 and 2 is reflected in the record gap 18. As a result, the gap of the recording head which has adopted a large track width suffers poor linearity and inevitably entrains an azimuth loss during the reading. The obscure track width of the magnetic reproducing head, therefore, causes azimuth loss.

SUMMARY OF THE INVENTION

An object of this invention, therefore, is to provide a magnetic sensor which allows accurate regulation of the read track width thereof and enjoys high sensitivity, suffers Barkhausen noise only sparingly, and excels in reliability. Another object of this invention is to provide a magnetic head and a magnetic recording apparatus which fit for systems of high recording density by repressing such azimuth loss.

The magnetic sensor of this invention is characterized by comprising a pair of hard magnetic films magnetized inplane in directions substantially perpendicular to the direction of a signal magnetic field and substantially equal to each other, a soft magnetic film formed in the same plane as the pair of hard magnetic films and interposed between the pair of hard magnetic films and held in contact therewith or in proximity thereto, and a signal magnetic field detecting film superposed on the main surface of the soft magnetic film.

The magnetic head of this invention is characterized by comprising a reproducing head using the magnetic sensor of this invention mentioned above and a recording head provided with a pair of magnetic pole layers vertically opposed to each other across a recording gap and possessed of a recording track width equal to or smaller than the reproducing track width of the reproducing head.

The magnetic recording•reproducing apparatus of the present invention is characterized by comprising the magnetic recording•reproducing head of this invention mentioned above and a magnetic recording medium and satisfying the expression, $L_2 \leq L_1 < L_3$, wherein $L_1$ stands for the reproducing track width of the magnetic recording•reproducing head, $L_2$ for the width of a track written in the magnetic recording medium by the recording head, and $L_3$ for the distance between the inner ends of two tracks adjacent to the track.

As concrete examples of the signal magnetic field detecting film in the magnetic sensor of this invention, a magnetoresistance film manifesting anisotropic magnetoresistance (hereinafter referred to as "AMR film") and a ferromagnetic film (hereinafter referred to as "GMR ferromagnetic film") forming part of such magnetoresistance elements as an artificial lattice film and a spin valve film which manifest giant magneto-resistance (GMR) may be cited.

In the sensor of this invention, owing to the construction described above, the direction of the magnetization of the soft magnetic film is controlled so as to be parallel to the direction of track width when the signal magnetic field is zero and, further owing to the exchange coupling with the soft magnetic film and the signal magnetic field detecting film, longitudinal bias is applied to the signal magnetic field detecting film substantially parallelly to the direction of track width. In this invention, since the magnetic field from the hard magnetic film is indirectly applied as longitudinal bias to the signal magnetic field detecting film through the medium of the soft magnetic film at this time, the soft magnetic property of the signal magnetic field detecting film is not impaired at least above the soft magnetic film. Moreover, since not only the magnetization of the signal magnetic field detecting film but also the magnetization of the soft magnetic film responds to the signal magnetic field during the detection of a signal magnetic field, the characteristic length of the magnetic sensor obtained consequently is augmented and consequently the soft magnetic property of the signal magnetic field detecting film is notably improved.

Further, the magnetic field from the hard magnetic film is applied with high efficiency to the soft magnetic film because the pair of hard magnetic films and the soft magnetic film interposed between the pair of hard magnetic films are flush with each other. Then, since the soft magnetic film is disposed in contact with or in proximity to the hard magnetic film, the leakage of the magnetic field from the hard magnetic film to the signal magnetic field detecting film or the like poses virtually no problem. As a result, the magnetic field directly applied from the hard magnetic film to the signal magnetic field detecting film is markedly repressed above the soft magnetic film and, specifically, the magnetization of the signal magnetic field detecting film superposed on the soft magnetic film in a width smaller than the distance between the pair of hard magnetic films will be sensitive to a signal magnetic field. As a result, the entire area in the direction of track width of the signal magnetic field detecting film above the soft magnetic film is allowed to form a signal magnetic field sensing part and the track width can be accurately regulated with the length in the direction of track width of the signal magnetic field detecting film or the distance between the pair of hard magnetic films. To be more specific, the length in the direction of track width of the signal magnetic field detecting film substantially constitutes itself the track width when the distance between the pair of hard magnetic films is equal to or greater than the length in the direction of track width of the signal magnetic field detecting film, whereas the distance between the pair of hard magnetic films substantially equals the track width when this distance is equal to or less than the length in the direction of track width of the signal magnetic field detecting film.

The magnetic sensor of this invention permits accurate regulation of track-width of a read head as described above. In the present invention, therefore, when the magnetic sensor which utilizes the magnetoresistance described above is used as a magnetic reproducing head, it permits accurate positioning the read head to the recorded track on the media. Therefore the recorded track width can be decreased. In other words, the magnetic recording•reproducing head and the magnetic recording•reproducing apparatus of this invention are enabled to acquire a highly satisfactory recording•reproducing property even with a recording head having such a small track width. As a further result, the width of the magnetic pole layer such as, for example, the upper magnetic pole layer which governs a recording track width is allowed to be decreased to the extent of not entraining a decrease in the linearity of the recording gap. The present invention, accordingly, permits prevention of the occurrence of azimuth loss due to the decline of the linearity of the recording gap.

Incidentally, in the magnetic recording•reproducing apparatus which uses as a magnetic reproducing head thereof the magnetic sensor of this invention constructed as described above, the magnetic recording medium to be used therein may be either an inplane magnetic recording medium or a perpendicular magnetic recording medium. The magnetic recording•reproducing head used in the apparatus may be kept in contact with or flying above the magnetic recording medium during recording or reproducing operation.

DESCRIPTION OF THE PREFERRED EMBODIMENTS

Now, this invention will be described more specifically below with reference to embodiments.

Figure 1:
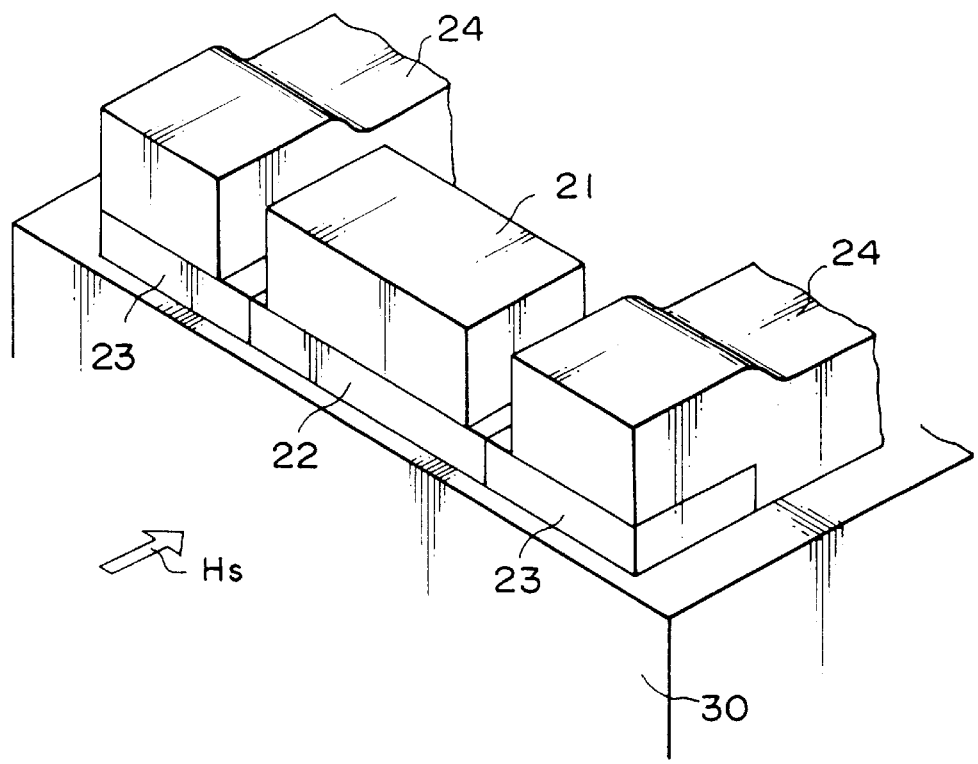
FIG. 1 is a perspective view showing the construction of a magnetic sensor according to the first embodiment of this invention.

FIG. 1 is a perspective view showing the construction of a magnetic sensor as the first embodiment of this invention. This magnetic sensor represents a case of being provided with an MR film exhibiting anisotropic magnetoresistance (AMR film) as a signal magnetic field detecting film. The AMR film destined to form a signal magnetic field detecting film 21, as shown in the diagram, is superposed on a soft magnetic film 22 and exchange coupled magnetically with the soft magnetic film 22.

The soft magnetic film 22 is so formed as to be flush with a pair of hard magnetic films 23 and 23 and, at the same time, interposed in such a manner between the pair of hard magnetic films 23 and 23 as to contact them. The direction of the magnetization of the soft magnetic film 22 is controlled by the pair of hard magnetic films 23 and 23 which are magnetized inplane in directions substantially perpendicular to the direction of a signal magnetic field and substantially equal to each other with the signal magnetic field $H_s$ in a state of zero. The magnetizations of the pair of hard magnetic films 23 and 23 are applied as bias magnetic fields to the signal magnetic field detecting film 21 and the signal magnetic field detecting film 21 is vested with a single domain property by the bias magnetic fields.

On the pair of hard magnetic films 23 and 23, a pair of electrodes for supplying a sense current for the detection of variation of resistance proportionate to the signal magnetic field of the signal magnetic field detecting film 21. The reference numeral 30 in the diagram stands for a substrate.

For the AMR film destined to serve as the signal magnetic field detecting film 21, a NiFe alloy film or a NiCo alloy film is used. The thickness of the signal magnetic field detecting film 21 is desired to be set in an approximate range of from 10 to 30 nm. The reason for this particular range is that the formation of the film is attained with difficulty and the surface of the formed film is inferior in quality and the so-called characteristic length is so small as to necessitate highly accurate depth control when the film thickness is unduly small, whereas the device suffers unduly low resistance and fails to acquire sufficient sensitivity when the film thickness is unduly large.

For the pair of hard magnetic films 23 and 23, it is desirable to use a ferromagnetic film having coercive force of not less than about 800 A/m. If the coercive force of the pair of hard magnetic films 23 and 23 is less than 800 A/m, the impartation of a sufficient bias magnetic field to the signal magnetic field detecting film 21 will possibly fail. Further from the viewpoint of decreasing the effect of a disturbed magnetic field, the coercive force of the pair of hard magnetic films 23 and 23 is desired to be not less than about 8000 A/m. Then, for the soft magnetic film 22, it is sufficient to use a ferromagnetic film having coercive force of less than about 800 A/m. If the coercive force of the soft magnetic film 22 exceeds 800 A/m, the magnetization of the signal magnetic field detecting film 21 will possibly be fixed and the sensitivity will be consequently degraded. Preferably, the coercive force of the soft magnetic film 22 is not more than 80 A/m.

The thickness of the pair of hard magnetic films 23 and 23 may be more or less smaller than that of the soft magnetic film 22. For the purpose of enabling the hard magnetic films 23 and 23 to apply a sufficient magnetic field to the soft magnetic film 22, however, it is desirable that the relation $t > 0.5 t' \cdot M_{s'}/M_s$, preferably the relation $t > t' \cdot M_{s'}/M_s$, be satisfied, wherein t stands for the thickness and $M_s$ for the saturated magnetization of the hard magnetic films 23 and 23 and t' for the thickness and $M_{s'}$ for the saturated magnetization of the soft magnetic film 22. Then, the thickness t' of the soft magnetic film 22 is desired to be set in the range of from 0.25 to 5 times, preferably 0.25 to 3 times, the thickness of the signal magnetic field detecting film 21. The reason for this particular range is that the impartation of a single domain property to the signal magnetic field detecting film 21 will not be easily attained if the thickness t' of the soft magnetic film 22 is unduly small, whereas the shunt current generated by the soft magnetic film 22 will increase during the supply of a sense current to the signal magnetic field detecting film 21 if the thickness t' of the soft magnetic film 22 is unduly large.

Then, regarding the length in the direction of magnetization of the pair of hard magnetic films 23 and 23, the signal magnetic field detecting film 21 and the soft magnetic film 22 may have an equal length or the soft magnetic film 22 may have a greater length as shown in FIG. 1. In cases where the soft magnetic film 22 has high resistance exceeding about 100 $\mu\Omega\cdot$cm, the efficient supply of a sense current to the signal magnetic field detecting film 21 will not be attained if the length of the soft magnetic film 22 is unduly large. Further, regarding the magnetization of the signal magnetic field detecting film 21 above the soft magnetic film 22, the length of the signal magnetic field detecting film 21 may be greater than that of the soft magnetic film 22 on the condition that the impartation of a single domain property permits repression of Barkhausen noise without substantially obstructing the rotation of the magnetization.

Figure 2:
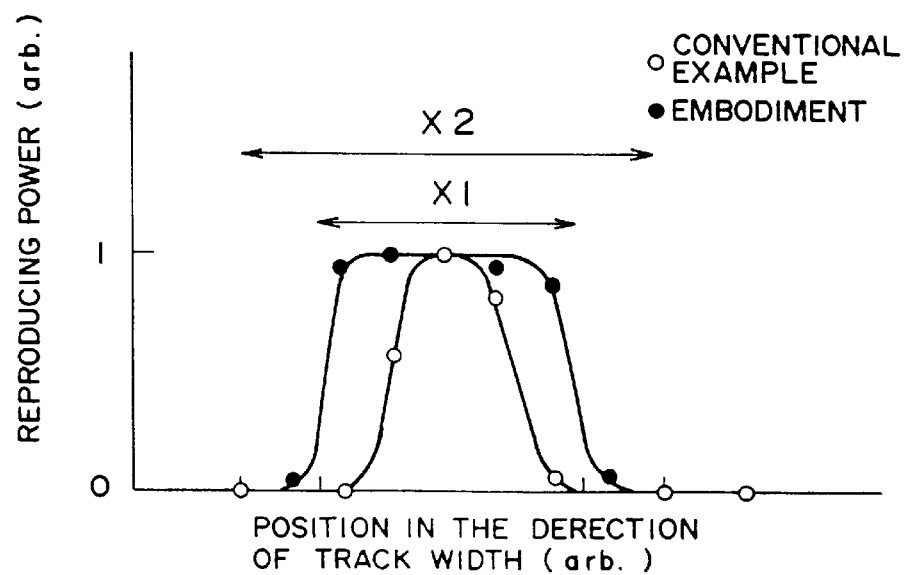
FIG. 2 is a characteristic diagram showing the regeneration sensitivity distribution in the direction of track width of the magnetic sensor according to the first embodiment in comparison with that of the conventional magnetic sensor.

Now, the results of the evaluation of the properties of the magnetic sensor shown in FIG. 1 will be described. The signal magnetic fields from the magnetic recording medium having a track width substantially equal to the length in the direction of track width of the signal magnetic field detecting film 21 were actually detected to determine sensitivity distribution in the direction of track width of the signal magnetic field detecting film 21. The results are shown in FIG. 2 in combination with the data of sensitivity distribution similarly determined of the conventional magnetic sensor shown in FIG. 15. In the diagram, the symbols $X_x$ and $X_2$ stand respectively for the lengths in the direction of track width of the signal magnetic field detecting film 21 and the soft magnetic film 22. It is clearly noted from FIG. 2 that the outputs of the opposite end parts in the direction of track width of the signal magnetic field detecting film 1 in the conventional magnetic sensor were notably lowered, whereas the outputs of the signal magnetic field detecting film 21 of the magnetic sensor of the present embodiment were stable substantially throughout the entire area in the direction of track width thereof. The data clearly indicate that the track width is accurately regulated by the length in the direction of track width of the signal magnetic field detecting film 21.

In the magnetic sensor of the first embodiment, therefore, the possibility that the magnetization of the signal magnetic field detecting film 21 will be fixed, for example, in the opposite end parts in the direction of track width thereof is nil because the magnetic fields from the pair of hard magnetic films 23 and 23 are applied as longitudinal bias indirectly to the signal magnetic field detecting film 21 through the medium of the soft magnetic film 22. As a result, the entire area in the direction of track width of the signal magnetic field detecting film 21 can be made to form a signal magnetic field sensing part and the track width can be accurately regulated by the length in the direction of track width of the signal magnetic field detecting film 21. Not only since the soft magnetic property of the signal magnetic field detecting film 21 defies impairment but also since the magnetization of the soft magnetic film 22 responds to a signal magnetic field during the detection of signal magnetic field, the signal magnetic field detecting film 21 preeminently excels in soft magnetic property and enjoys further augmentation of sensitivity.

Figure 3:
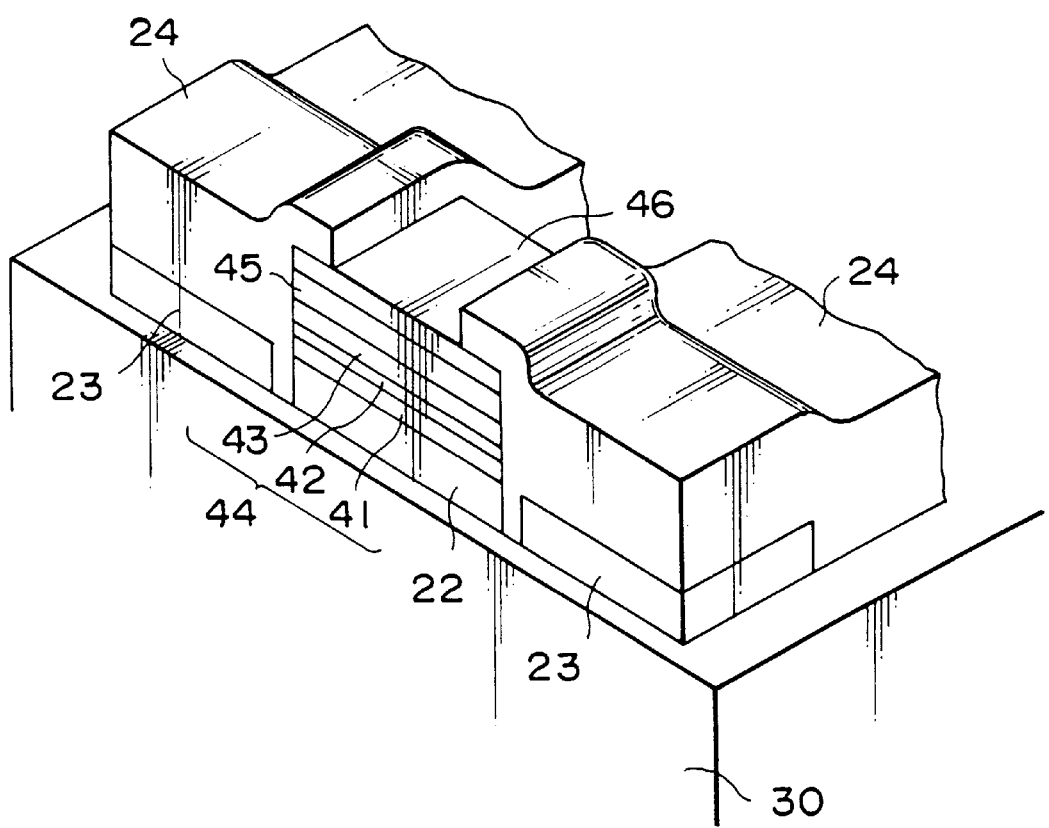
FIG. 3 is a perspective view showing the construction of a magnetic sensor according to the second embodiment of this invention.

FIG. 3 is a perspective view showing the construction of a magnetic sensor according to the second embodiment of the present invention. This magnetic sensor represents a case of using a GMR ferromagnetic film forming part of a spin valve film as a signal magnetic field detecting film in an MR element provided with a spin valve film exhibiting magnetoresistance. In the magnetic sensor shown in FIG. 3, like component parts found in the construction of FIG. 1 are denoted by like reference numerals and will be omitted from the description to be given hereinbelow.

In the magnetic sensor of the present embodiment, a spin valve film 44 is formed by sequentially superposing a GMR ferromagnetic film destined to form a signal magnetic field detecting film 41, a nonmagnetic film 42, and a ferromagnetic film as a magnetization-fixing film 43 in the order mentioned on a soft magnetic film 22 as shown in the diagram. On the spin valve film 44, an antiferromagnetic film 45 for fixing the magnetization of the magnetization-fixing film 43 and a protective film 46 are sequentially superposed in the order mentioned. At this time, the magnetization of the magnetization-fixing film 43 is fixed in the direction substantially perpendicular to the direction of the track width and the state of perpendicular bias is obtained between this film 43 and the signal magnetic field detecting film 41. Further, a pair of terminals 24 and 24 are formed as partly superposed on the laminated layers obtained above.

For the spin valve film 44, laminated films such as, for example, Co/Cu/Co, CeFe/Cu/CoFe, and NiFe/Cu/NiFe are usable. Then, for the antiferromagnetic film 45, a γ-FeMn film and a NiO film are usable. For the protective film 46, a Ta film, a Ti film, etc. are usable.

In FIG. 3, the soft magnetic film 22 is depicted as interposed between the pair of hard magnetic films 23 and 23 in such a manner as not to contact them. From the viewpoint of suppressing the possible application of leak magnetic fields from the hard magnetic films 23 and 23 to the signal magnetic field detecting film 21 or the like, the soft magnetic film 22 is desired to be so disposed as to contact the hard magnetic films 23 and 23. Even when the soft magnetic film 22 is not allowed to contact the hard magnetic films 23 and 23, it is desired to be so disposed as to approximate to them to the fullest possible extent. To be specific, the gap between the soft magnetic film 22 and the hard magnetic films 23 and 23 is desired to be set at or below 0.5 $\mu$m.

Now, the results of the evaluation of the properties of the magnetic sensor shown in FIG. 3 will be described below. First, when the sensitivity distribution in the direction of track width of the signal magnetic field detecting film 41 was determined in the same manner as in the first embodiment, the outputs were as stable substantially throughout the entire area in the direction of track width of the signal magnetic field detecting film 41 as were found in the first embodiment. The data clearly indicate that the track width is accurately regulated by the length in the direction of track width of the signal magnetic field detecting film 41.

Figure 4:
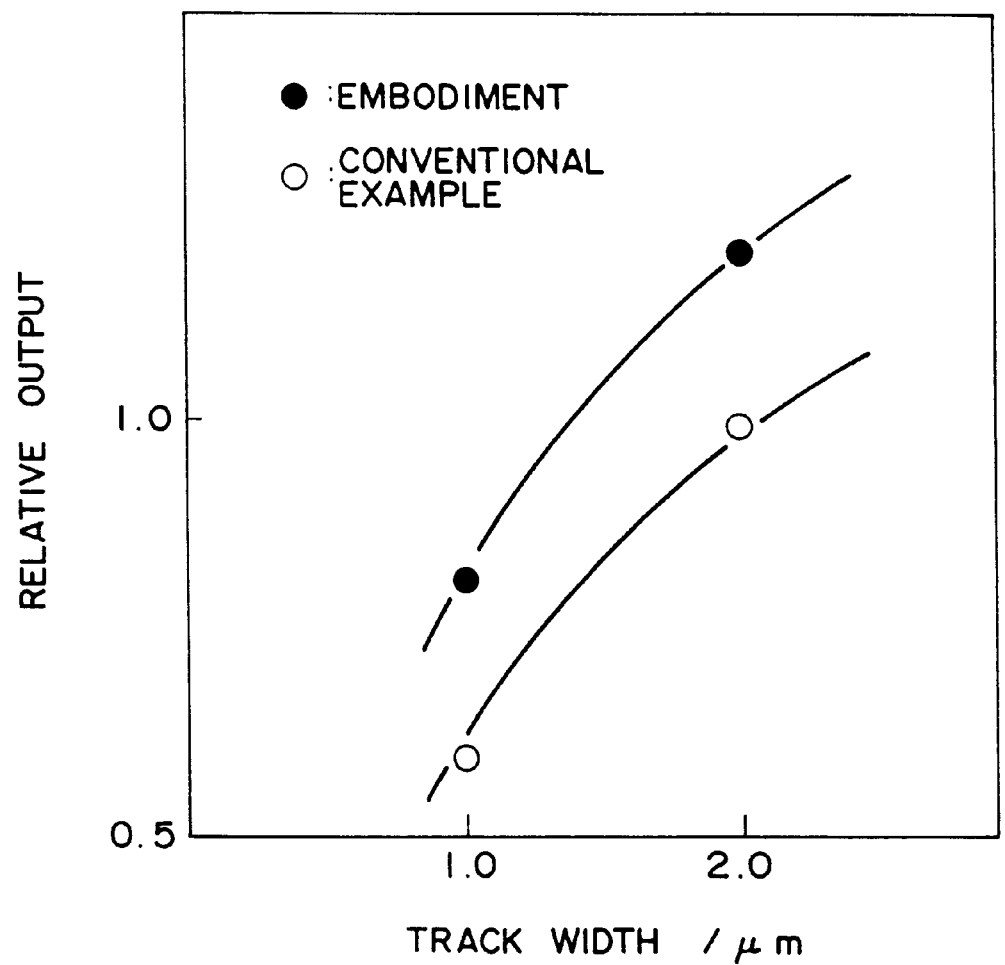
FIG. 4 is a characteristic diagram showing the relation between the track width and the output of the magnetic sensor according to the second embodiment in comparison with that of the conventional magnetic sensor.

FIG. 4 shows the relation between the track width and the output of the magnetic sensor of the second embodiment. The term "conventional example" appearing in FIG. 4 refers to the results of the determination similarly carried out on the magnetic sensor shown in FIG. 22. In this magnetic sensor, the distance between the hard magnetic films 3 and 3 corresponds to a track width. It is clearly noted from FIG. 4 that the magnetic sensor of the second embodiment showed an improvement of about 20% in output over the conventional magnetic sensor where the track width was 2 µm, for example, and that it showed an improvement of about 30% in output over the conventional sensor where the track width was 1 µm. The data indicate that the magnetic sensor of the second embodiment is effective in decreasing the track width and, when given a decreased track width, is allowed to manifest a higher output than the conventional magnetic sensor. This trend was similarly observed in the magnetic sensor of the first embodiment.

Figure 5:
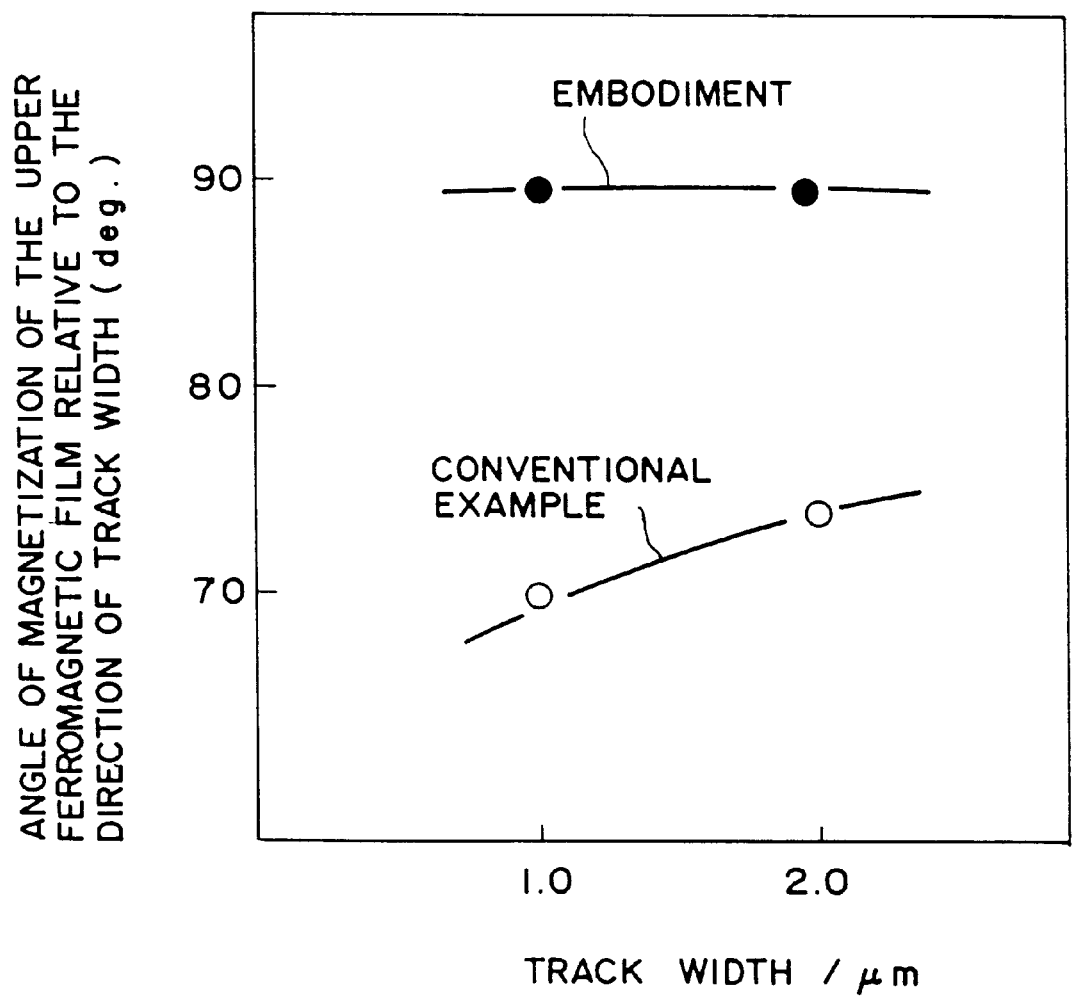
FIG. 5 is a characteristic diagram showing the relation between the track width and the angle of the magnetization of the upper ferromagnetic film relative to the track width obtained of the magnetic sensor according to the second embodiment in comparison with that of the conventional magnetic sensor.
Figure 22:
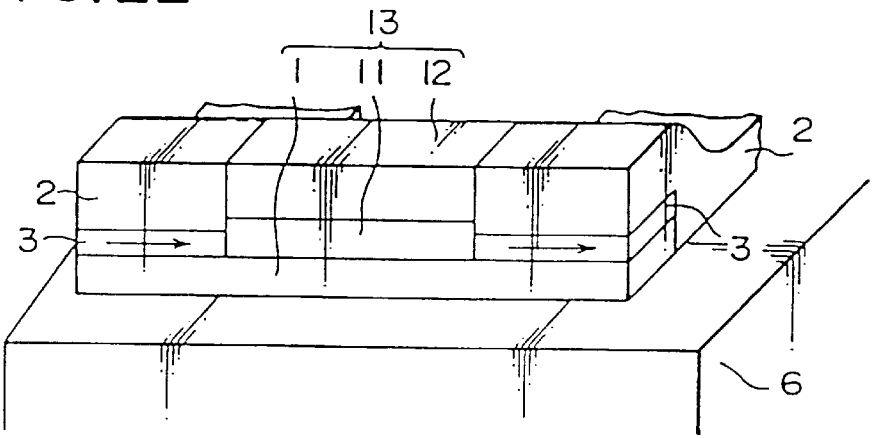
FIG. 22 is a perspective view showing one example of the construction of a magnetic sensor using the conventional spin valve film.
Figure 23:
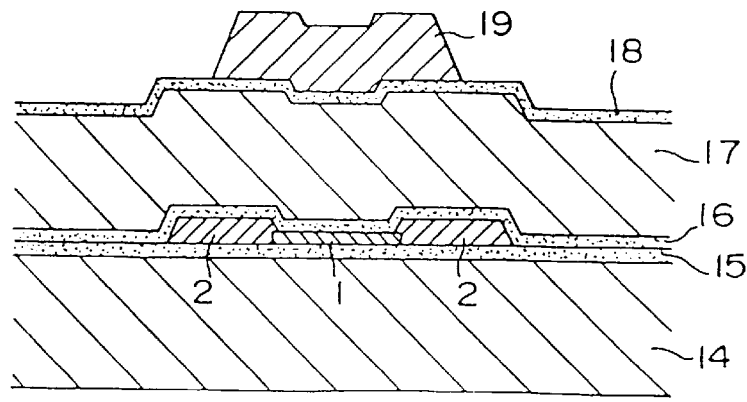
FIG. 23 is a cross section showing one example of the construction of a conventional magnetic recording•reproducing head.

FIG. 5 is a diagram showing the relation between the track width and the angle formed by the magnetization of the upper ferromagnetic film, namely the ferromagnetic film as the magnetization-fixing film 43 in the magnetic sensor of the second embodiment or the ferromagnetic film 12 in the magnetic sensor shown in FIG. 22, relative to the direction of track width. It is noted from this diagram that in the conventional magnetic sensor, the angle of the magnetization mentioned above was caused by leak magnetic fields from the hard magnetic films 3 and 3 to produce a deviation of about 20 degrees from 90 degrees, i.e. the ideal angle of perpendicular bias, and the size of this deviation increased in proportion as the track width decreased from 2 µm to 1 µm. In contrast thereto, in the magnetic sensor of the present embodiment, this angle was not dependent on the track width and was retained at the ideal angle, 90 degrees, of perpendicular bias. The data indicate that the magnetic sensor of the second embodiment allows thorough repression of Barkhausen noise and permits regeneration of high sensitivity.

Figure 6:
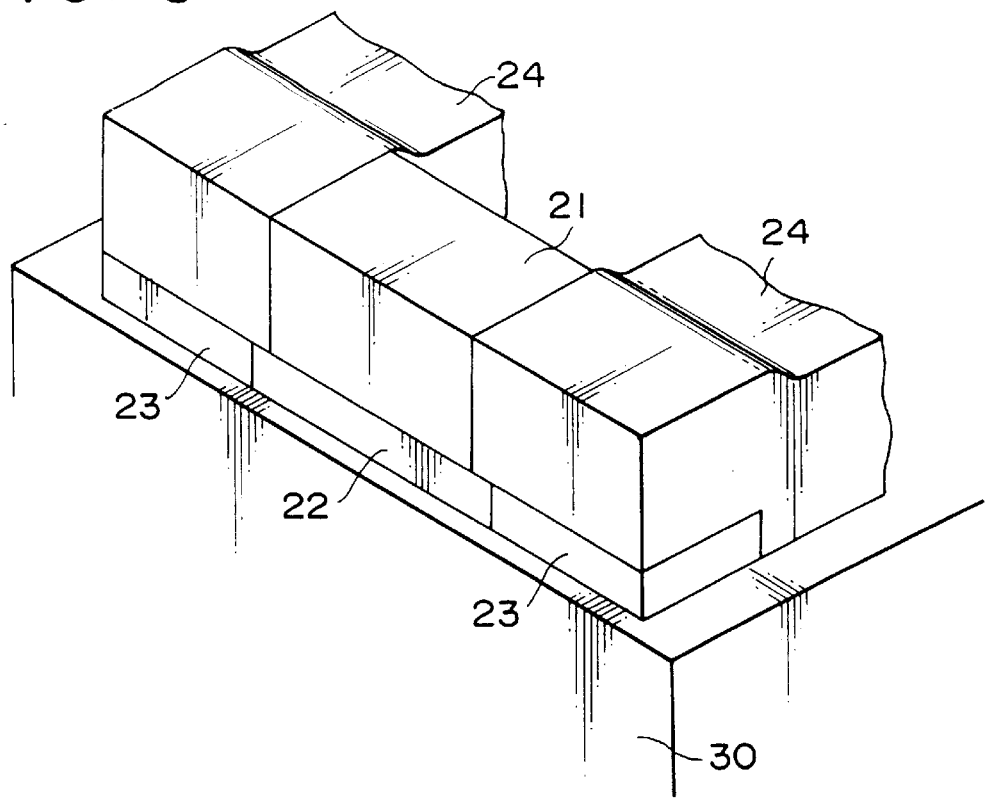
FIG. 6 is a perspective view showing a modification of the magnetic sensor according to the first embodiment.
Figure 7:
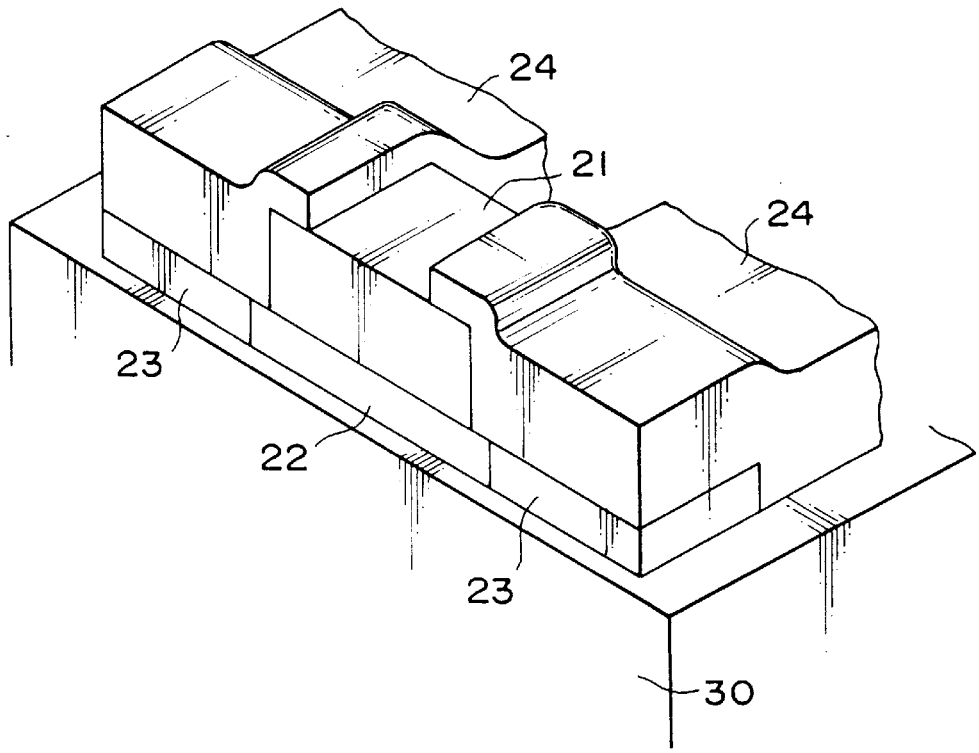
FIG. 7 is a perspective view showing another modification of the magnetic sensor according to the first embodiment.

The magnetic sensors of the embodiments cited above may be altered as shown in FIG. 6, FIG. 7, FIG. 8, FIG. 9, and FIG. 10. The magnetic sensor of the first embodiment, for example, may be altered so that the pair of terminals 24 and 24 will contact the signal magnetic field detecting film 21 as shown in FIG. 6 or they will be partly superposed as shown in FIG. 7. In these constructions, a saving on power consumption can be expected because the supply of a sense current to the signal magnetic field detecting film 21 is accomplished without the aid of the pair of hard magnetic films 23 and 23 and the soft magnetic film 22. The same remarks hold good for the magnetic sensor of the second embodiment. In cases where the pair of terminals 24 and 24 are so formed as to be partially superposed on the signal magnetic field detecting film 21 or the like, however, the width of superposition of the terminals 24 and 24 on the signal magnetic field detecting film 21 is desired to be set at or below about 0.1 µm from the viewpoint of ensuring efficient supply of the sense current to the signal magnetic field detecting film 21.

Figure 8:
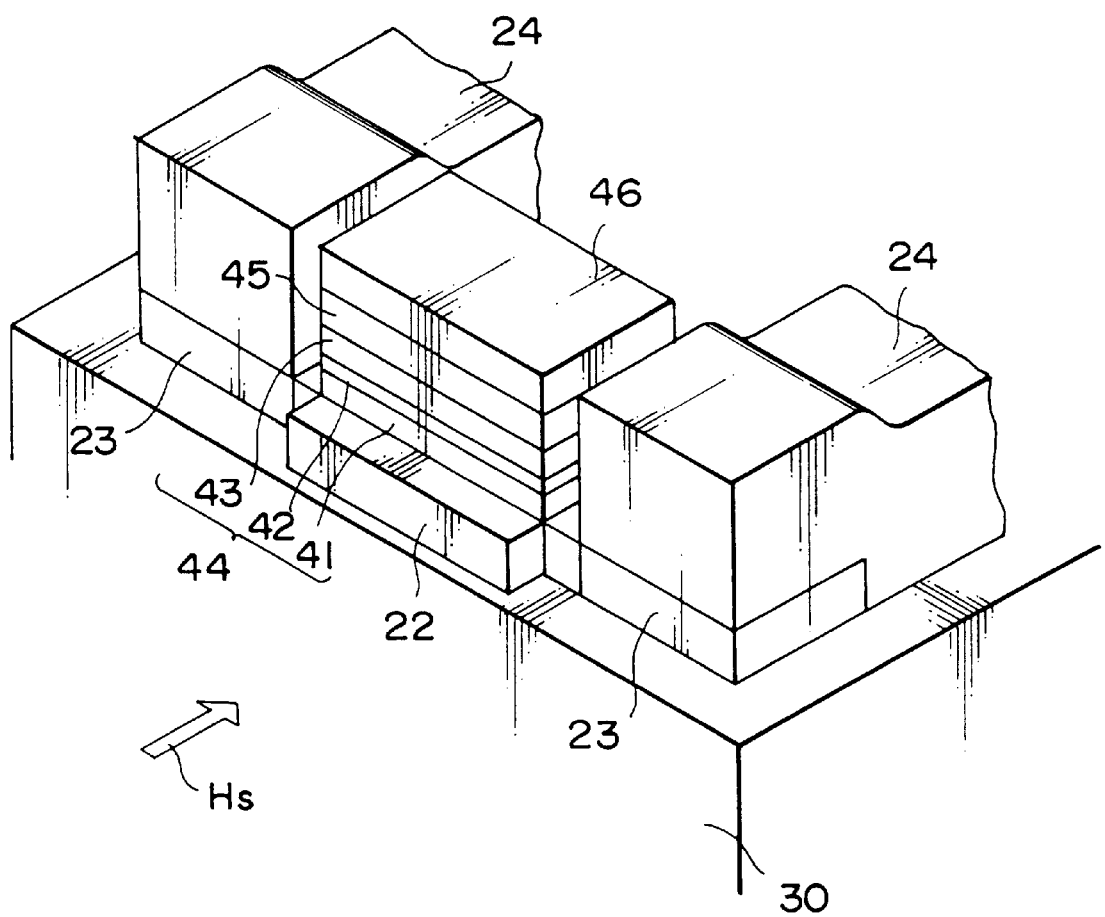
FIG. 8 is a perspective view showing a modification of the magnetic sensor according to the second embodiment.
Figure 9:
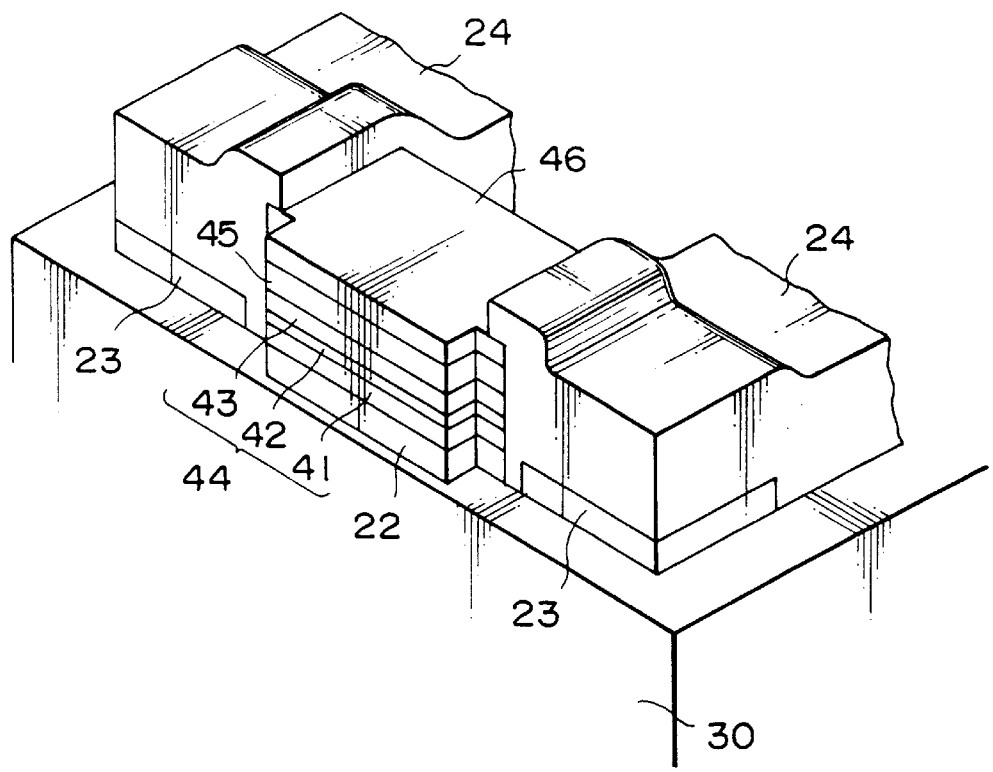
FIG. 9 is a perspective view showing another modification of the magnetic sensor according to the second embodiment.
Figure 10:
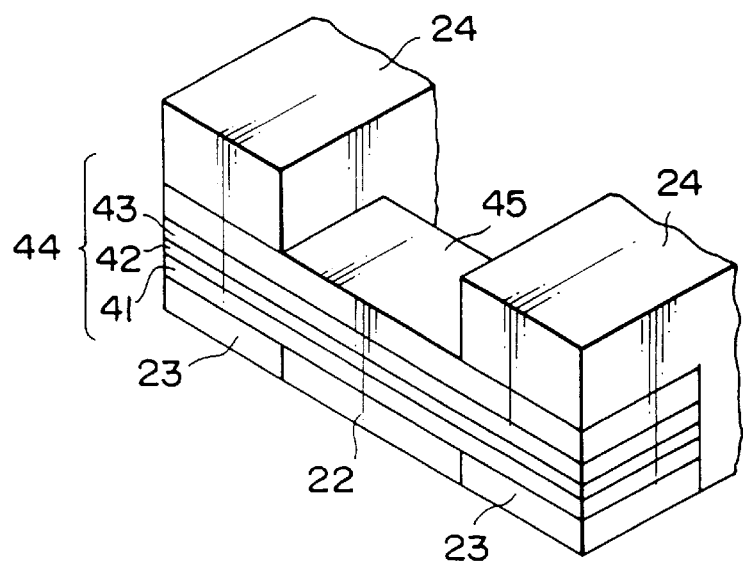
FIG. 10 is a perspective view showing yet another modification of the magnetic sensor according to the second embodiment.
Figure 11A:
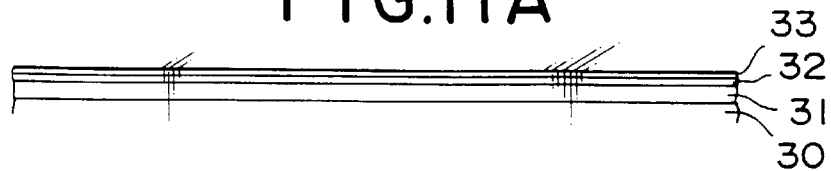
FIGS. 11A–11E are perspective views showing one example of the process for the production of the magnetic sensor of the present invention.
Figure 11B:
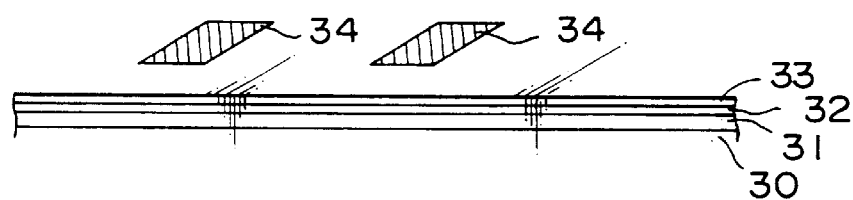
Figure 11C:
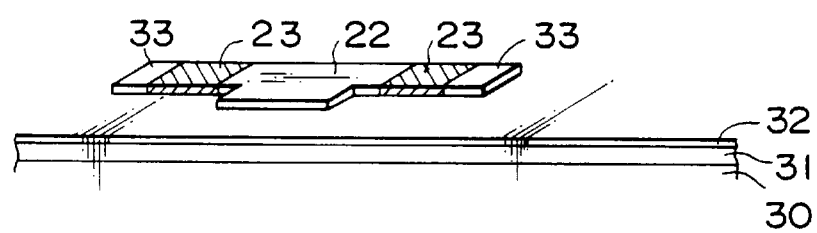
Figure 11D:
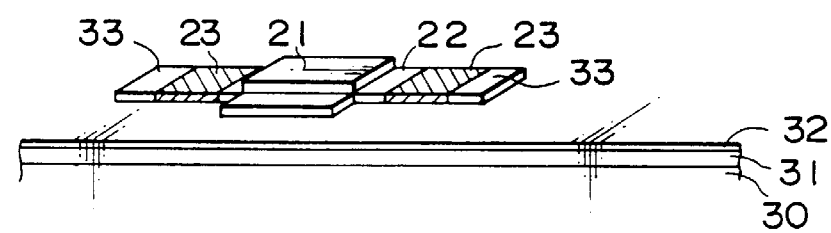
Figure 11E:
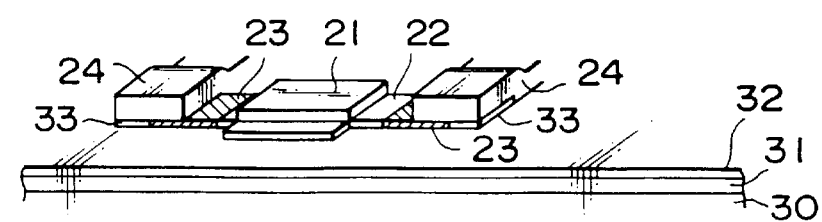

Then, the magnetic sensor of the second embodiment may be so altered that part of the soft magnetic film 22 will protrude in the direction of inflow of a signal magnetic field and the spin valve film 44, the antiferromagnetic film 45, and the protective film 46 will be formed as superposed in conformity with the width of the protruding part as shown in FIG. 8 or part of the laminated part composed of the spin valve film 44, the antiferromagnetic film 45, and the protective film 46 will protrude in the direction of inflow of a signal magnetic field as shown in FIG. 9. These constructions definitely permit regulation of the track width. Further, the alteration may be so made that the spin valve film 44 and the antiferromagnetic film 45 will be formed in a flush pattern on the soft magnetic film 22 and the hard magnetic films 23 and 23 as shown in FIG. 10. In this case, however, the signal magnetic field detecting film 41 and the hard magnetic films 23 and 23 are desired to avoid forming a magnetic connection so that the rotation of the magnetization of the signal magnetic field detecting film 41 may not be obstructed by the hard magnetic films 23 and 23.

It is permissible to utilize the magnetic fields from the hard magnetic films 23 and 23 for collectively applying both a longitudinal bias and a lateral bias to the signal magnetic field detecting film 21 (41) by imparting a deviation of certain extent from 90 degrees to the angle formed by the directions of the magnetizations of the hard magnetic films 23 and 23 relative to the directions of signal magnetic fields within the range in which the direction of the magnetization of the soft magnetic film 22 can be regulated so as to be substantially parallellized to the direction of track width with the signal magnetic field in a state of zero. Then, it is permissible, in the first embodiment, to form a soft magnetic film on the signal magnetic field detecting film 21 through the medium of a nonmagnetic film and enable the magnetic field formed by a sense current to be applied as a lateral bias to the signal magnetic field detecting film 21.

Now, the process used for the production of magnetic sensors described above. FIG. 11 is a process diagram showing one example of the process for the production of the magnetic sensor according to this invention. By the process of production shown in FIG. 11, first a magnetic shield layer 31 formed as of a NiFe alloy, a magnetic gap 32 formed as of $Al_2O_3$, and a soft magnetic amorphous film 33 formed as of CoZrNb or CoZrRe are sequentially superposed in the order mentioned on a substrate 30 formed as of $Al_2O_3$.TiC and provided on the surface thereof with an insulating layer formed as of $Al_2O_3$ (FIG. 11-A).

Then, stated areas of the soft magnetic amorphous film 33 are irradiated with a laser beam to give rise to a pair of fixed regions 34 and 34 having an area of about 5×5 µm through crystallization of the amorphous texture (FIG. 11-B). Thereafter, the soft magnetic amorphous film 33 is eroded to a stated shape by the ion milling technique to give rise to a pair of hard magnetic films 23 and 23 and a soft magnetic film 22 interposed therebetween (FIG. 11-C). The pair of hard magnetic films 23 and 23 have originated from the fixed regions 34 and 34 formed by the exposure to a laser beam. At this time, for the purpose of fixing the magnetizations of the pair of hard magnetic films 23 and 23 in the directions mentioned, part of the soft magnetic amorphous film 33 is desired to be crystallized with a magnetostatic field of the order of 10 kA/m applied in a stated direction.

Subsequently, the surface of the soft magnetic film 22 is optionally cleansed on the atomic level by the sputter etching technique or the like, then the signal magnetic field detecting film 21 is formed on the soft magnetic film 22 by the lift-off technique, for example, (FIG. 11-D) and the pair of terminals 24 and 24 as of Cu or Ti are superposed on the hard magnetic films 23 and 23 (FIG. 11-E). In consequence of the procedure described above, the magnetic sensor according to the first embodiment shown in FIG. 1 is completed. An MR head of the shield type is easily manufactured by further forming a magnetic gap, a magnetic shield layer, and the like suitably on the magnetic sensor in the same manner as in the lower part. The magnetic sensor obtained in this case has a construction such that part of the soft magnetic film 22 is made to protrude in the direction of inflow of a signal magnetic field as shown in the diagram and, as a result, the track width is definitely regulated by the width of the protruding part of the soft magnetic film 22.

The magnetic sensor according to the second embodiment shown in FIG. 3 is obtained by sequentially superposing the GMR ferromagnetic film destined to form a signal magnetic field detecting film 41 instead of the signal magnetic field detecting film 21 mentioned above, the nonmagnetic film 42, a ferromagnetic film as the magnetization-fixing film 43, the antiferromagnetic film 45, and the protective film 46 in the order mentioned.

The process of production described above obviates the necessity for a step for forming a hard magnetic film and a step for PEP because it produces the fixed regions 34 by exposing a stated area of the soft magnetic amorphous film 33 to a laser beam without the use of a mask. Thus, the process allows a generous decrease in the number of steps of production process. Besides, with respect to the adaptation of the magnetic head for the multi-channel system, this process proves advantageous in terms of space. Further, in contrast to the crystallized hard magnetic film 23 of low resistance which has the terminals 14 superposed thereon, the signal magnetic field detecting film 21 is formed as superposed on the soft magnetic film 22 of high resistance having an amorphous state. For this reason, the voltage drop in the hard magnetic film 23 can be repressed and, at the same time, the shunt current generated by the soft magnetic film 23 can be decreased even when the sense current is supplied from the terminals 24 to the signal magnetic field detecting film 21 through the medium of the soft magnetic film 23. As a result, the sense current can be efficiently supplied to the signal magnetic field detecting film 21 and the magnetic sensor of high sensitivity can be consequently obtained.

Figure 12:
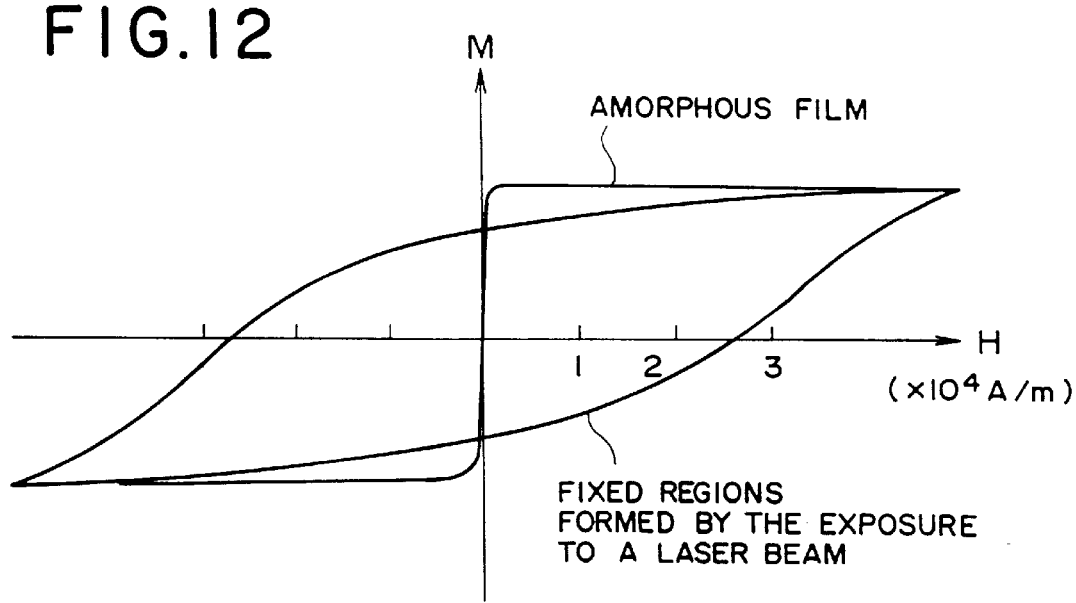
FIG. 12 is a diagram showing one example of the magnetization curve obtained in the fixation of a soft magnetic amorphous film by the laser annealing.

FIG. 12 shows one example of the change of magnetization curve observed when a $Co_{87}Zr_5Nb_8$ amorphous film was crystallized by laser annealing of 873 K×2 h. It is noted from this diagram that the film which had showed soft magnetism of about 80 A/m of coercive force in the initial amorphous state was fixed so much by the laser annealing as to manifest coercive force of not less than 25000 A/m. By crystallizing the soft magnetic amorphous film by the laser annealing thereby generating strain in the part exposed to the laser and, by virtue of this strain, exerting stress on the soft magnetic film 22 and the signal magnetic field detecting film 21 superposed thereon, the single domain of the signal magnetic field detecting film 21 can be stabilized and the application of bias can be effectively implemented. At this time, the part of the soft magnetic amorphous film which has been exposed to the laser beam is enabled to generate either tensile stress or compressive stress by devising the foundation of the soft magnetic amorphous film. For the effective application of a bias to the signal magnetic field detecting film 21 in the direction of track width thereof, the magnetostriction constant of the soft magnetic amorphous film must be positive where the exposed part generates tensile stress and the magnetostriction constant of the soft magnetic amorphous film must be negative where the exposed part generates compressive stress.

Figure 13A:
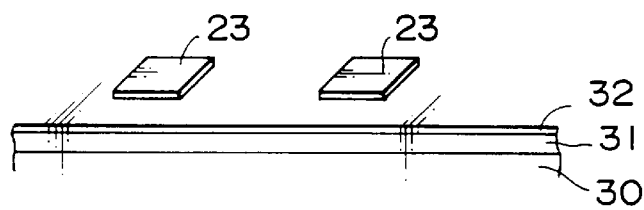
FIG. 13A–13C are perspective views showing another example of the process for the production of the magnetic sensor of the present invention.
Figure 13B:
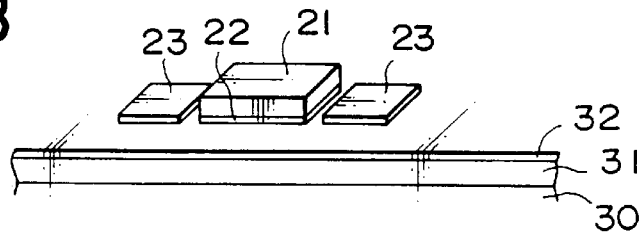
Figure 13C:
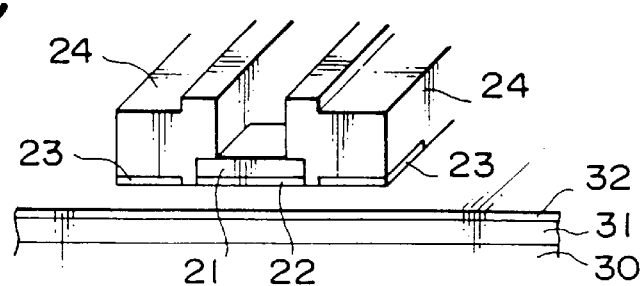

The magnetic sensor of this invention, otherwise, can be manufactured by forming the soft magnetic film and the hard magnetic film in two separate steps. In this case, for the hard magnetic film, a CoCr alloy film, a CoPt alloy film, or the like is usable. To be specific, a pair of hard magnetic films 32 and 32 made of a CoPt alloy or the like are formed in a stated shape as shown in FIG. 13 on a substrate 30 having preparatorily formed thereon a magnetic shield layer 31 made of a NiFe alloy or the like and a magnetic gap 32 (FIG. 13-D). Then, a soft magnetic film 22 and a signal magnetic field detecting film 21 made of an AMR film are sequentially formed in the order mentioned by the lift-off technique between the pair of hard magnetic films 32 and 32 (FIG. 13-B). Thereafter, by having a pair of terminals 24 and 24 superposed on the hard magnetic films 23 and 23, such magnetic sensors as are shown in FIG. 1, FIG. 6, and FIG. 7 are obtained. Such a magnetic sensor as is shown in FIG. 3 is alternatively obtained by sequentially superposing a GMR ferromagnetic film destined for form a signal magnetic film detecting film 41 in the place of the signal magnetic field detecting film 21 destined to form the AMR film, a nonmagnetic film 42, a ferromagnetic film as a magnetization-fixing film 43, an antiferromagnetic film 45, and a protective film 46 in the order mentioned.

Figure 14:
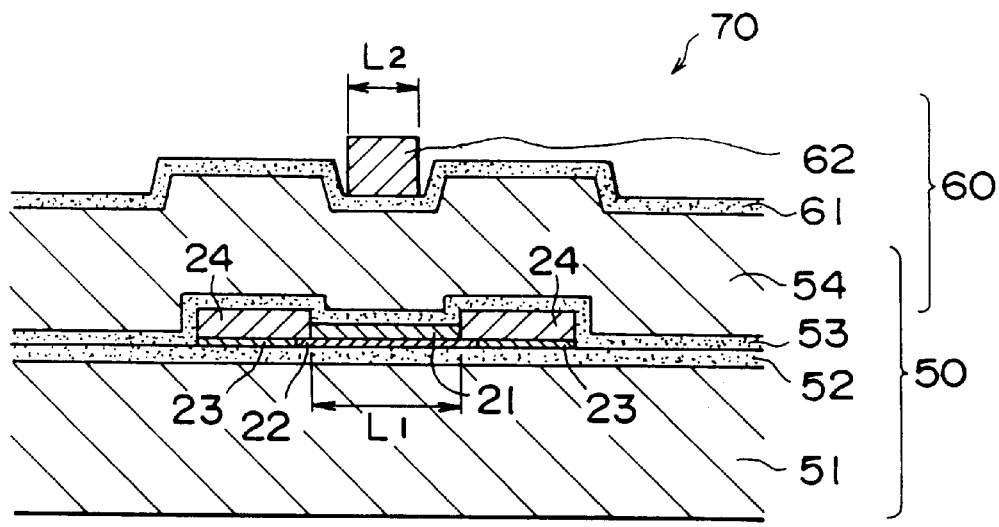
FIG. 14 is a cross section showing the construction of a magnetic recording•reproducing head according to the first embodiment of this invention.

FIG. 14 is a cross section showing the construction of a magnetic recording•reproducing head according to one embodiment of this invention as seen from the side opposed to a medium. In a magnetic recording•reproducing head shown in FIG. 14, a reproducing head 50 comprises a shield type MR head using the magnetic sensor of the first embodiment described above. A magnetic recording•reproducing head 70 is composed of this reproducing head 50 and a recording head 60.

Specifically, on a lower magnetic shield layer 51 which is made of such a soft magnetic amorphous alloy as a NiFe alloy or a CoZrNb alloy, a pair of hard magnetic films 23 and 23 and a soft magnetic film 22 which are component elements of the magnetic sensor of the first embodiment are superposed through the medium of a reproducing magnetic gap 52 which is made of $Al_2O_3$ or the like. A signal magnetic field detecting film 21 made of an AMR film is superposed on the soft magnetic film 22 and a pair of terminals 24 and 24 made of Cu, Ti, or the like are formed on the pair of hard magnetic films 23 and 23. Then, an upper magnetic shield layer 54 is superposed thereon through the medium of a reproducing magnetic gap 53. These components jointly complete the reproducing head 50 formed of the shield type MR head using the magnetic sensor of this invention.

On the reproducing head 50 mentioned above, the recording head 60 which is formed of an induction type magnetic head using the upper magnetic shield layer 54 as a lower magnetic pole layer thereof is formed. In the lower magnetic pole layer which concurrently serves as the upper magnetic shield layer 54, therefore, a recording magnetic gap 61 made of $Al_2O_3$ is formed. On this recording magnetic gap 61 is formed an upper magnetic pole layer 62 which regulates the recording track width.

In the magnetic recording•reproducing head 70, the substantial reproducing track width L, which is regulated by the length in the direction of track width of the signal magnetic field detecting film 21 of the reproducing head 50 is equal to or larger than the substantial recording track width $L_2$ which is regulated by the length in the direction of track width of the upper magnetic pole layer 62 of the recording head 60. Then, the recording track width $L_2$ is set within the range in which the surface of the upper magnetic pole layer 62 opposed to the recording magnetic gap 61 does not lose linearity.

In other words, the magnetic recording•reproducing head 70 of this embodiment has realized the ideal of narrow write and wide read. This success is due exclusively to the construction of the reproducing head 50 by the use of the magnetic sensor of this invention. Specifically, the reproducing head 50 formed by the use of the magnetic sensor of this invention satisfies the relation that the recording track width $L_2$ is equal to or smaller than the reproducing track width $L_2$ not only because a large output is obtained even when the track width is decreased but also because the so-called off-track output, i.e. the output obtained when the reproducing head 50 deviates from a (record) track written in on a magnetic recording medium, assumes lateral symmetry and dwindles abruptly. Besides, this reproducing head 50 acquires an ideal recording•reproducing property in a system of high recording density because it precludes the occurrence of azimuth loss.

While the magnetic recording•reproducing head 70 mentioned above uses the magnetic sensor of this invention as a shield type MR head thereof, it can be adapted for the so-called yoke type MR head which has the magnetic sensor of this invention disposed in a substantially annular magnetic circuit containing in part thereof a magnetic gap opposed to a magnetic recording medium. Even this yoke type MR head is capable of producing a large reproducing output as compared with the MR head which uses the conventional MR element.

Figure 15:
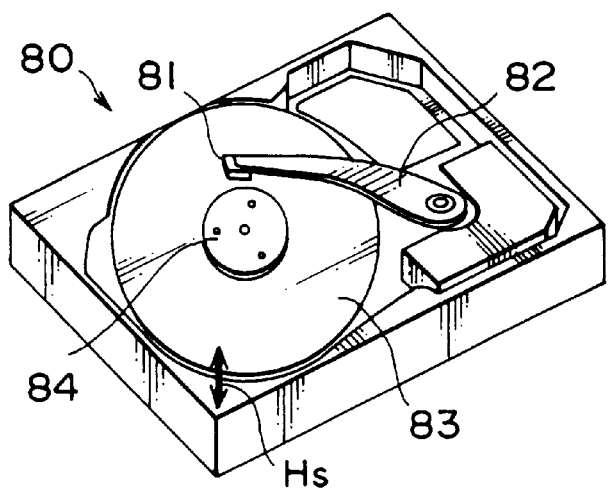
FIG. 15 is a perspective view showing the construction of a magnetic recording•reproducing apparatus according to the first embodiment of this invention.
Figure 16:
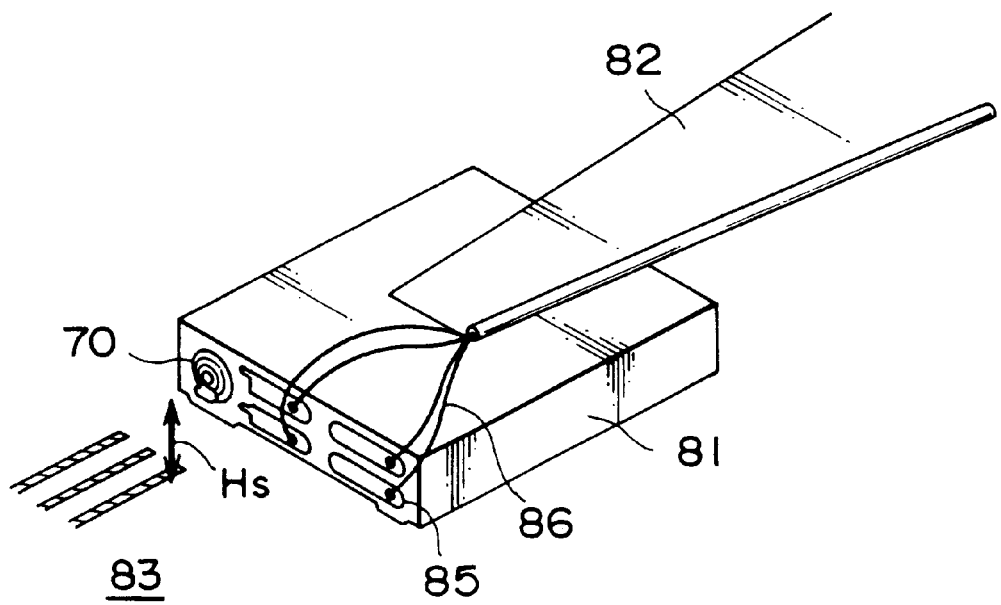
FIG. 16 is a perspective view showing as magnified the essential part of the magnetic recording•reproducing apparatus shown in FIG. 15.

FIG. 15 is a perspective view showing one example of the magnetic recording•reproducing apparatus 80 which uses the magnetic recording•reproducing head 70 mentioned above and FIG. 16 is a diagram showing the essential part of the apparatus as magnified. The magnetic recording•reproducing head 70 mentioned above is incorporated as a recording•reproducing element in a head part 81 which is provided at the leading end of an actuator 82. The magnetic recording•reproducing head 70 is disposed in such a manner that the opposed surface of a medium may be opposed to a magnetic recording medium 83 as shown in FIG. 14. Here, the magnetic recording medium 83 is adapted to be rotated by a spindle motor 84. In the diagram, the reference numeral 85 stands for a bonding pad for extraction from the magnetic recording•reproducing head 70 and the reference numeral 86 for a lead line for connecting the extracting bonding pad 85 to an external part.

Figure 17:
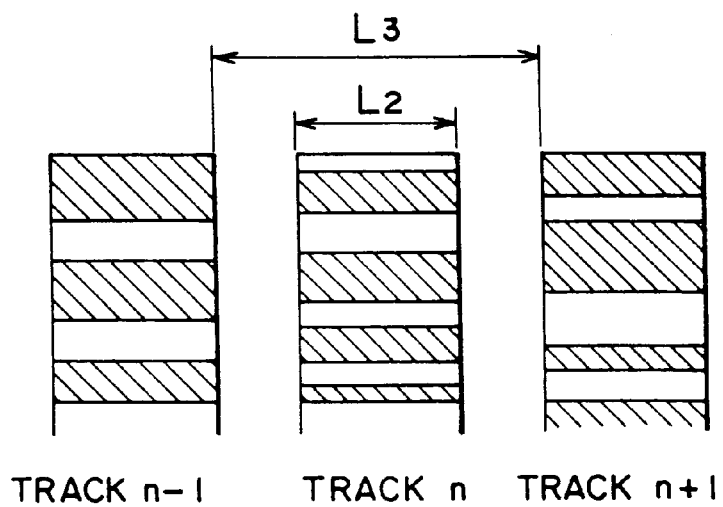
FIG. 17 is a diagram to aid in the description of the relation between the reproducing track width in the magnetic recording•reproducing apparatus of this invention and the track width on the magnetic recording medium side.
Figure 18:
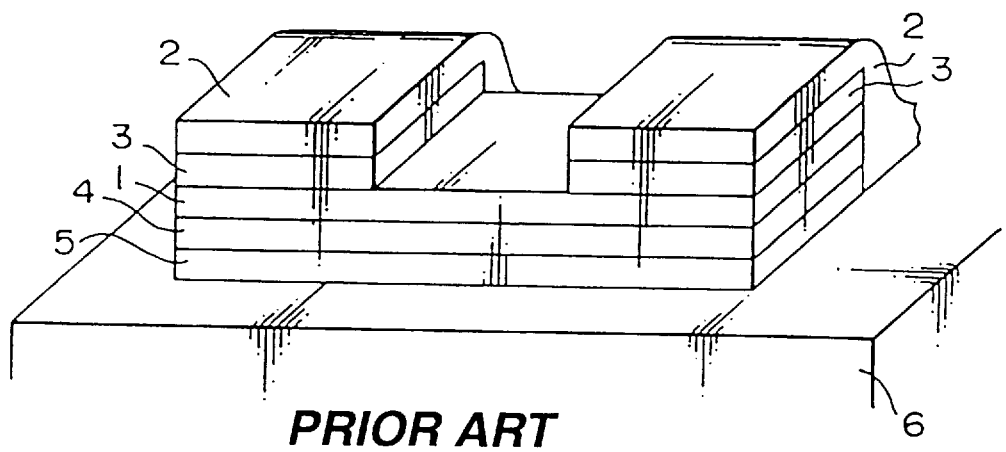
FIG. 18 is a perspective view showing one example of the construction of the conventional magnetic sensor.
Figure 19:
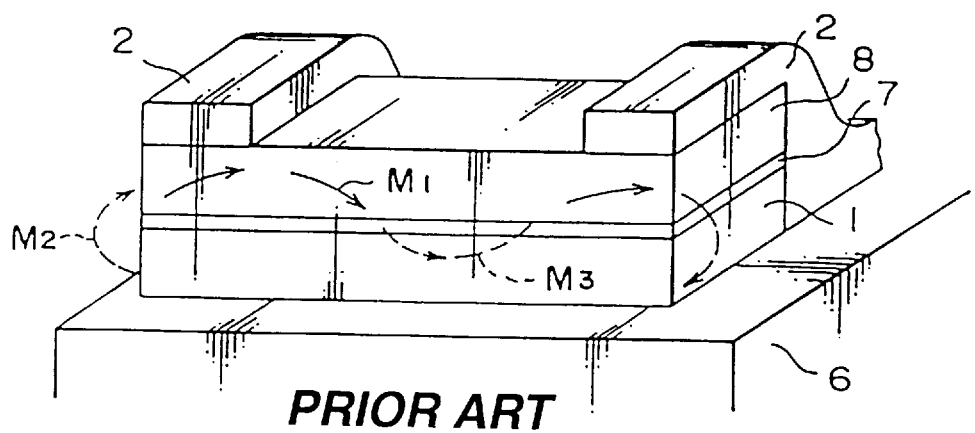
FIG. 19 is a perspective view showing another example of the construction of the conventional magnetic sensor.
Figure 20:
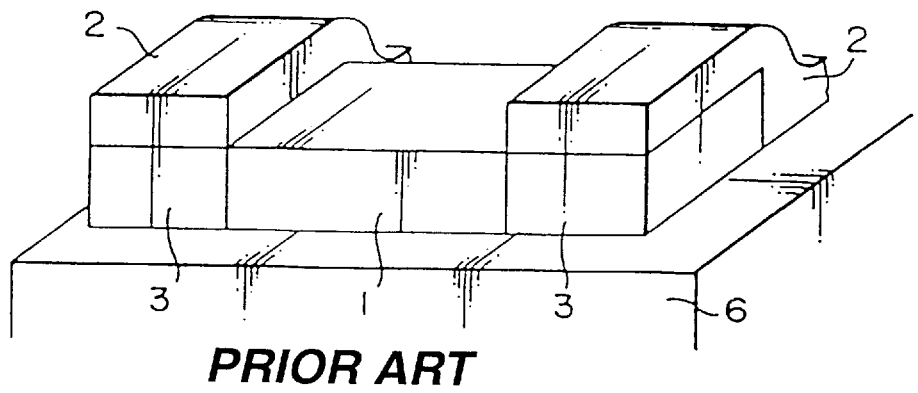
FIG. 20 is a perspective view showing yet another example of the construction of the conventional magnetic sensor.
Figure 21:
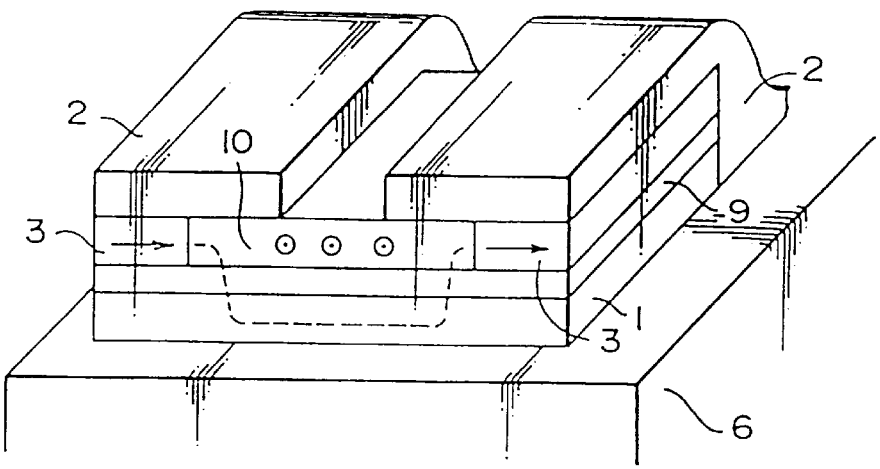
FIG. 21 is a perspective view showing still another example of the construction of the conventional magnetic sensor.

In this magnetic recording•reproducing apparatus 80, the reproducing track width $L_1$ produced by the reproducing head in the magnetic recording•reproducing head 70 of the construction shown in FIG. 14 is so set as to be smaller than the distance between the inner ends of the two tracks adjacent to the track n written by the recording head in the magnetic recording medium 83 shown in FIG. 17, namely the distance $L_3$ between the inner ends of the track n−1 and the track n+1 adjacent to the track n. Further, since the width of the track n is substantially determined by the recording track width $L_2$, the reproducing track width $L_1$ is so set as to satisfy the relation, $L_2 \leq L_1 < L_3$. As a result, the reproducing property can be improved and, at the same time, the occurrence of such adverse phenomena as off-track and azimuth loss can be precluded.

According to the magnetic recording•reproducing apparatus which is constructed as described above, the improvement of the recording•reproducing property is attained because a large reproducing output is obtained even when the width of recording track is decreased for the purpose of accomplishing the improvement of recording density.

What is claimed is:

1. A magnetic sensor comprising:

a magnetoresistance effect film having first and second ferromagnetic films, a nonmagnetic film interposed between the first and second ferromagnetic films, the first ferromagnetic film having a soft magnetic layer laminated therewith, the magnetization direction of the first ferromagnetic film being substantially perpendicular to the magnetization direction of the second ferromagnetic film when a signal magnetic field is zero, the magnetization direction of the second ferromagnetic film being fixed, and the magnetoresistance effect film having a pair of end regions separated by a center sensing region;

a pair of bias films producing a longitudinal bias to the first ferromagnetic film, the first ferromagnetic film being disposed between the pair of bias films; and a pair of electrodes producing a current flow through the magnetoresistance effect film, the pair of electrodes being disposed on top surfaces of the pair of end regions.

2. The magnetic sensor according to claim 1, wherein the first ferromagnetic film receives substantially unidirectional longitudinal bias along its surface from the pair of bias films.

3. The magnetic sensor according to claim 1, further comprising film fixing the magnetization direction of the second ferromagnetic film.

4. The magnetic sensor according to claim 1, further comprising a protective film disposed on top surfaces of the magnetoresistance effect film.

5. The magnetic sensor according to claim 1, wherein the pair of bias films comprises a pair of hard magnetic films.

6. The magnetic sensor according to claim 1, wherein the soft magnetic layer and the pair of bias films are on a same support.

\* \* \* \* \*